(12) United States Patent
Chen

(10) Patent No.: US 10,613,118 B2
(45) Date of Patent: Apr. 7, 2020

(54) PROBE HEAD, PROBE MODULE AND PRODUCTION METHOD THEREOF

(71) Applicant: Winbond Electronics Corp., Taichung (TW)

(72) Inventor: Kuang Yu Chen, Hsinchu (TW)

(73) Assignee: Winbond Electronics Corp., Taichung (TW)

(*) Notice: Subject to any disclaimer, the term of this patent is extended or adjusted under 35 U.S.C. 154(b) by 269 days.

(21) Appl. No.: 15/790,905

(22) Filed: Oct. 23, 2017

(65) Prior Publication Data
US 2018/0231583 A1 Aug. 16, 2018

(30) Foreign Application Priority Data
Feb. 13, 2017 (CN) .......................... 2017 1 0075419

(51) Int. Cl.
*G01R 1/073* (2006.01)
*G01R 1/067* (2006.01)
*G01R 31/3185* (2006.01)
*G01R 31/28* (2006.01)

(52) U.S. Cl.
CPC ....... *G01R 1/0735* (2013.01); *G01R 1/06733* (2013.01); *G01R 1/06761* (2013.01); *G01R 1/07342* (2013.01); *G01R 31/318511* (2013.01); *G01R 31/2863* (2013.01)

(58) Field of Classification Search
CPC .......... G01R 1/0735; G01R 31/318511; G01R 1/06733; G01R 1/06761; G01R 31/2863; G01R 1/07342; G01R 1/07307
See application file for complete search history.

(56) References Cited

U.S. PATENT DOCUMENTS

| 4,866,374 A | 9/1989 | Cedrone | |
|---|---|---|---|
| 7,144,554 B1* | 12/2006 | Gulla | B01L 3/0262 422/521 |
| 2004/0124861 A1* | 7/2004 | Zaerpoor | G01R 1/07314 324/756.04 |
| 2005/0018017 A1* | 1/2005 | Silverbrook | B41J 2/14 347/54 |
| 2005/0039549 A1* | 2/2005 | Teraoka | G01L 1/22 73/862.627 |
| 2011/0074457 A1* | 3/2011 | Roderick | G01R 1/0466 324/756.02 |
| 2015/0028907 A1* | 1/2015 | Shinohara | G01R 1/07342 324/750.2 |

FOREIGN PATENT DOCUMENTS

| CN | 103543298 A | 1/2014 |
|---|---|---|
| KR | 101380162 B1 | 4/2014 |
| TW | 201428300 A | 7/2014 |
| WO | WO9858266 A1 | 12/1998 |

* cited by examiner

*Primary Examiner* — Christopher P McAndrew
*Assistant Examiner* — Zannatul Ferdous
(74) *Attorney, Agent, or Firm* — Muncy, Geissler, Olds & Lowe, P.C.

(57) ABSTRACT

A probe head is provided. The probe head includes a substrate, a plurality of probes, a post and a fastening sleeve. The probes are disposed on the substrate. The substrate is affixed to one end of the post. The fastening sleeve is affixed to the other end of the post.

14 Claims, 9 Drawing Sheets

PROBE HEAD, PROBE MODULE AND PRODUCTION METHOD THEREOF

CROSS REFERENCE TO RELATED APPLICATIONS

This Application claims priority of China Patent Application No. 201710075419.7, filed on Feb. 13, 2017, the entirety of which is incorporated by reference herein.

BACKGROUND OF THE INVENTION

Field of the Invention

The present invention relates to a probe module and a probe head thereof, and in particular to a probe module and a probe head thereof with increased detection efficiency.

Description of the Related Art

Conventional probe modules are composed by probe units which are arranged on a straight line, and the straight line passes through the diagonal of each probe unit. Conventionally, due to the metal traces arrangement requirement, the number of probe units of one single probe module is eight at most. Therefore, a conventional probe module can only detect eight chips simultaneously.

Additionally, in the production process of a conventional probe module, the probe units are positioned under a glass mask. The distance between the glass mask and the probe units is limited. Therefore, the whole row of probe units must be adjusted simultaneously. The position of one single probe unit cannot be adjusted individually.

BRIEF SUMMARY OF THE INVENTION

In one embodiment of the invention, a probe head is provided. The probe head includes a substrate, a plurality of probes, a post and a fastening sleeve. The probes are disposed on the substrate. The substrate is affixed to one end of the post. The fastening sleeve is affixed to the other end of the post.

In one embodiment, the substrate comprises a rectangular recess, and the probes are arranged on four sides of the rectangular recess.

In one embodiment, the fastening sleeve comprises a threaded hole, the probe head is adapted to be affixed to a base plate, and a fastener passes through the base plate and is affixed into the threaded hole to affix the probe head to the base plate.

In one embodiment, the fastening sleeve is wedged into the post by being fitted tightly or with glue.

In one embodiment, the post comprises a positioning recess, and the substrate is wedged into the positioning recess.

In one embodiment, the substrate comprises epoxy resin, the post is cylindrical, and the post comprises ceramic.

In one embodiment of the invention, a probe module is provided. The probe module includes a base plate, a plurality of fasteners and a plurality of probe heads. The probe head includes a substrate, a plurality of probes, a post and a fastening sleeve. The probes are disposed on the substrate. The substrate is affixed to one end of the post. The fastening sleeve is affixed to the other end of the post, wherein the fastener passes through the base plate and is affixed into the fastening sleeve to affix the probe head to the base plate.

In one embodiment, the probe module further comprises at least one fastening seat, and the base plate comprises a first surface and a second surface, wherein the first surface is opposite to the second surface, the probe heads are disposed on the first surface, the fastening seat is disposed on the second surface and corresponds to the probe heads, and the fastener passes through the base plate and the fastening seat and is affixed into the fastening sleeve to affix the probe head to the base plate.

In one embodiment, the probe module further comprises a plurality of spacers, wherein the spacers respectively abut the fastening sleeves, and the fastener passes through the spacer.

In one embodiment, the probe heads are arranged in a matrix.

In one embodiment, a method for producing a probe module is provided. The method comprises the following steps. First, a base plate and a plurality of fasteners are provided. Then, a plurality of probe heads are provided, wherein each probe head comprises a substrate, a plurality of probes, a post and a fastening sleeve, the probes are disposed on the substrate, the substrate is affixed to one end of the post, and the fastening sleeve is affixed to the other end of the post. Next, a coordinate measuring machine is provided. Then, the probe heads are positioned on the base plate by the coordinate measuring machine. Next, the probe heads are affixed to the base plate by the fasteners to fix the positions of the probe heads.

In one embodiment, a distance is formed between the coordinate measuring machine and the probe heads, and the distance is greater than 100 mm.

In one embodiment, in the step of positioning the probe heads on the base plate, a peak of one of the probes of each probe head is manually aligned with a positioning mark.

In one embodiment, the method for producing a probe module further comprises the step of welding the probes to the base plate.

In the embodiment of the invention, the conventional glass mask is replaced by the coordinate measuring machine to position the probe heads. The operating space for positioning the probe heads is therefore increased. Utilizing the probe heads of the embodiment of the invention, the position of the probe heads (probe units) can be adjusted individually, and the probe heads can be assembled. The coordinate measuring machine increases the efficiency of positioning the probe heads. Additionally, the one single probe module of the embodiment of the invention has more probe heads, and the detection efficiency is therefore increased.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
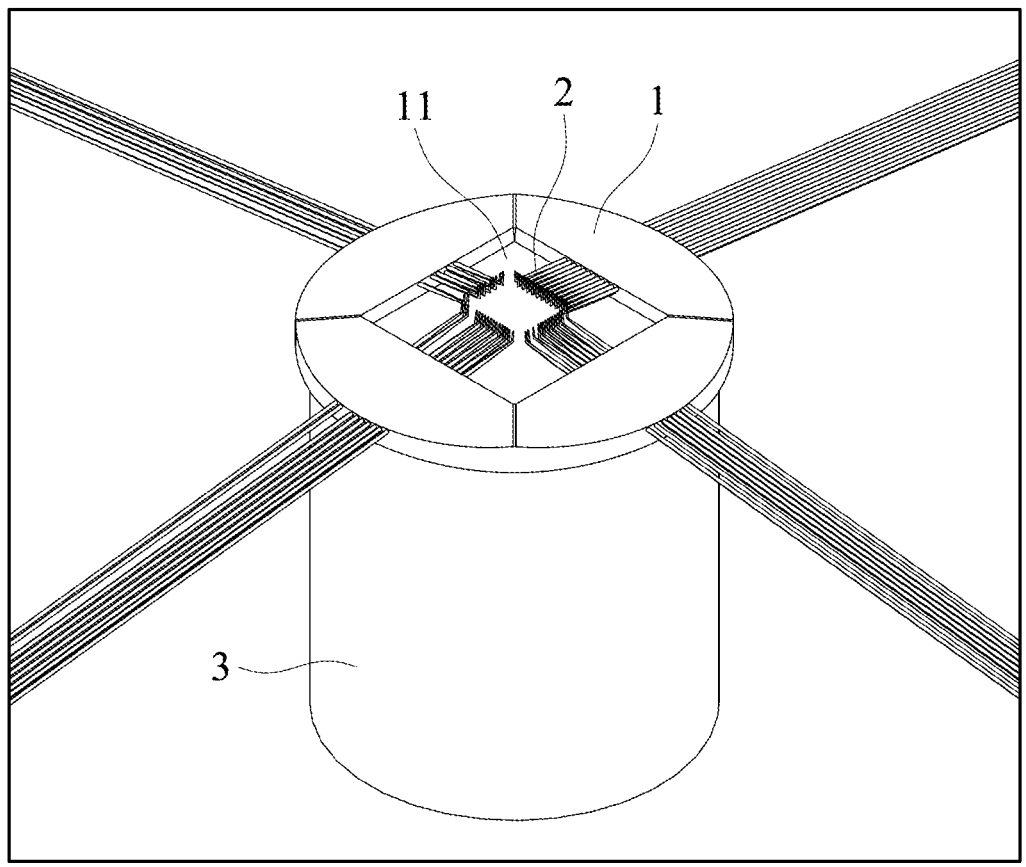
FIG. 1A is a perspective view of a probe head of an embodiment of the invention.
Figure 1B:
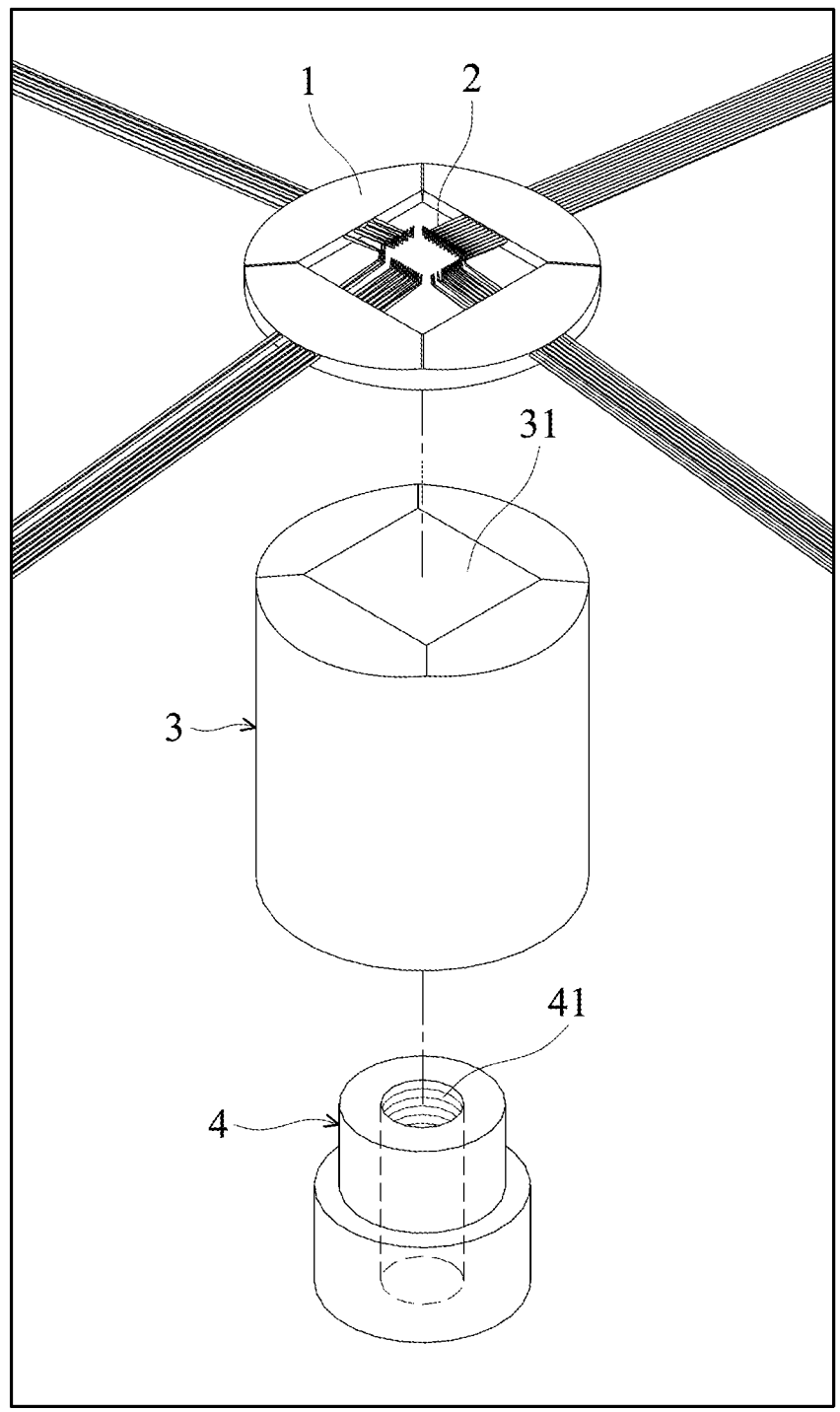
FIG. 1B is an exploded view of the probe head of the embodiment of the invention.

FIG. 1A is a perspective view of a probe head of an embodiment of the invention. FIG. 1B is an exploded view of the probe head of the embodiment of the invention. With reference to FIGS. 1A and 1B, the probe head P of the embodiment includes a substrate 1, a plurality of probes 2, a post 3 and a fastening sleeve 4. The probes 2 are disposed on the substrate 1. The substrate 1 is affixed to one end of the post 3. The fastening sleeve 4 is affixed to the other end of the post 3.

With reference to FIGS. 1A and 1B, the substrate 1 comprises a rectangular recess 11, and the probes 2 are arranged on four sides of the rectangular recess 11. The fastening sleeve 4 comprises a threaded hole 41. The probe head P is adapted to be affixed to a base plate. A fastener passes through the base plate and is affixed into the threaded hole 41 to affix the probe head P to the base plate. In one embodiment, the fastening sleeve 4 is wedged into the post 3 by being fitted tightly or with glue.

With reference to FIGS. 1A and 1B, in one embodiment, the post 3 comprises a positioning recess 31, and the substrate 1 is wedged into the positioning recess 31. The positioning recess 31 provides the positioning function and simplifies the assembly process of the probe head P. Similarly, the substrate 1 can be wedged into the post 3 by being fitted tightly or with glue.

With reference to FIGS. 1A and 1B, in one embodiment, the substrate 1 comprises epoxy resin. The post 3 is cylindrical. The post 3 comprises ceramic. In one embodiment, the post 3 is made of ceramic to reduce the influence it has on the detection result caused by temperature variations. In one embodiment, the post 3 can also be made of glass or another material.

Figure 2A:
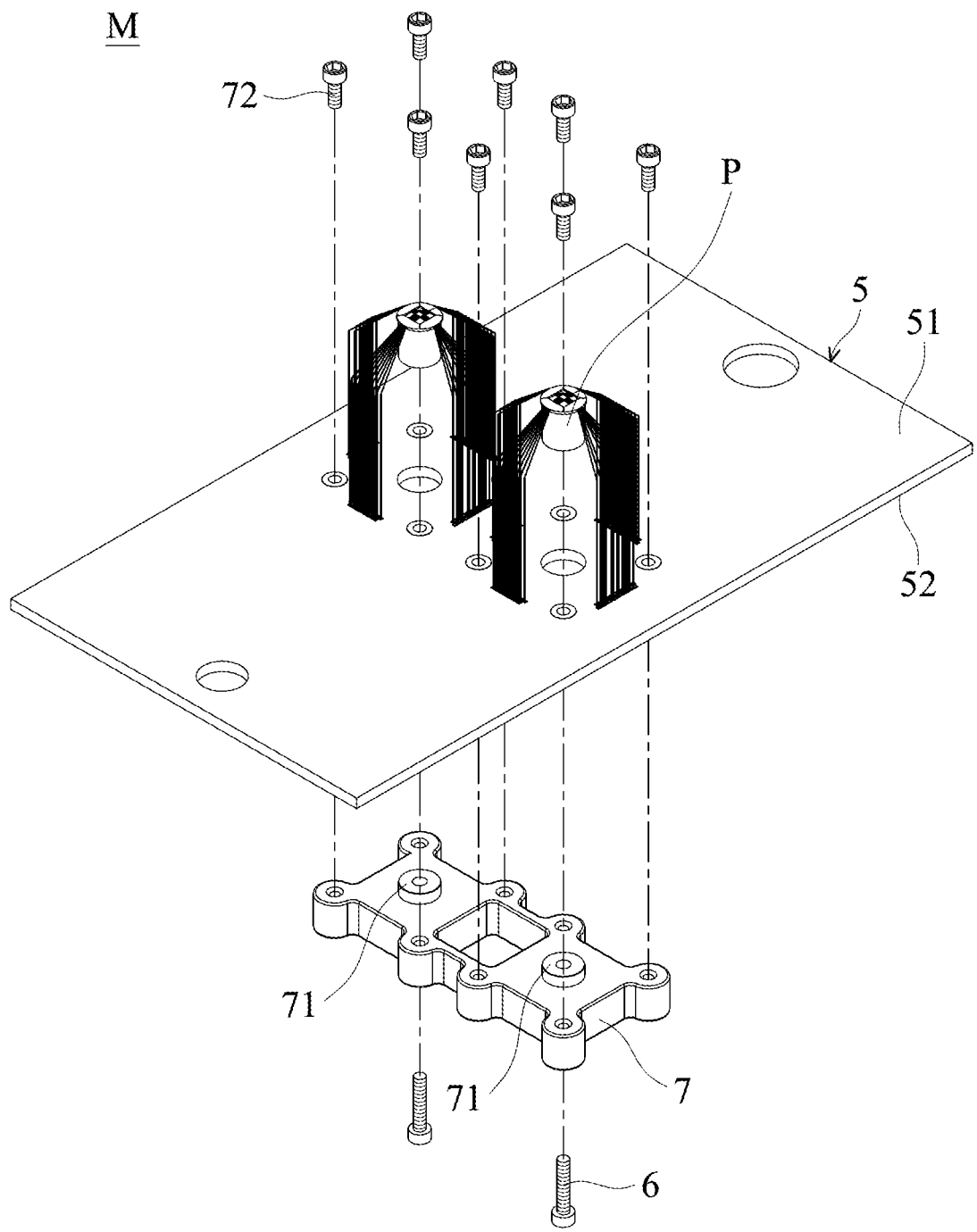
FIG. 2A is an exploded view of a probe module of the embodiment of the invention.
Figure 2B:
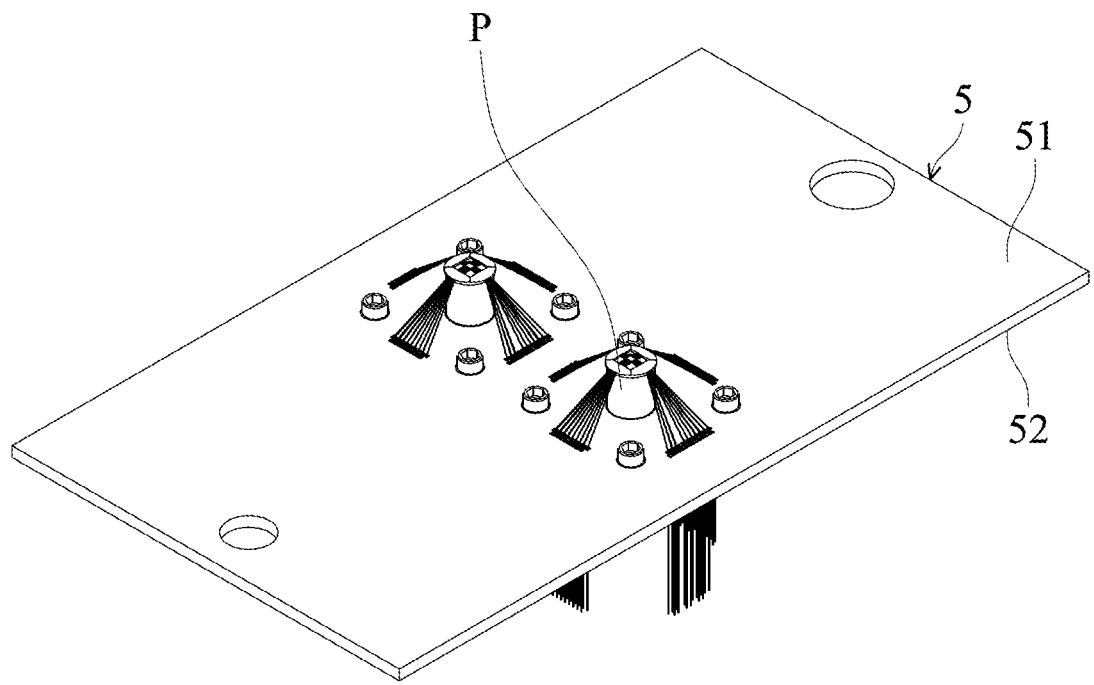
FIG. 2B is an assembled view of the probe module of the embodiment of the invention.

The probe heads of the embodiment of the invention can be assembled into a probe module M. FIG. 2A is an exploded view of the probe module M of the embodiment of the invention. FIG. 2B is an assembled view of the probe module M of the embodiment of the invention. With reference to FIGS. 2A and 2B, the probe module M includes a base plate 5, a plurality of fasteners 6 and a plurality of probe heads P. The probe head P includes the substrate, the probes, the post and the fastening sleeve mentioned above. The fastener 6 passes through the base plate 5 and is affixed into the fastening sleeve of the probe head P to affix the probe head P to the base plate 5.

Figure 2C:
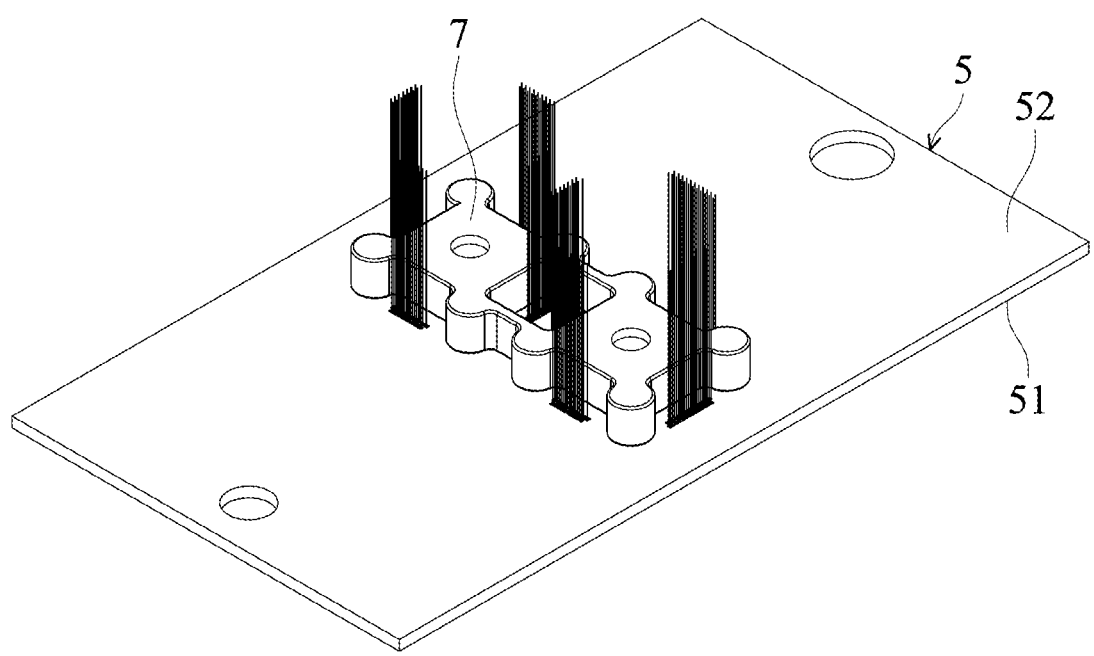
FIG. 2C shows the back side of the probe module of the embodiment of the invention.

With reference to FIGS. 2A and 2B, in one embodiment, the probe module M further comprises at least one fastening seat 7. The base plate 5 comprises a first surface 51 and a second surface 52. The first surface 51 is opposite to the second surface 52. The probe heads P are disposed on the first surface 51. The fastening seat 7 is disposed on the second surface 52 (with reference to FIG. 2C) and corresponds to the probe heads P. The fastener 6 passes through the base plate 5 and the fastening seat 7 and is affixed into the fastening sleeve of the probe head P to affix the probe head P to the base plate 5. In one embodiment, the probe module M further comprises a plurality of spacers 71. The spacers 71 respectively abut the fastening sleeves 4, and also abut the fastening seat 7. The fastener 6 passes through the spacer 71. In one embodiment, the spacer 71 is flexible. Utilizing the spacer 71 and the fastening seat 7, the affixing angle of the probe head P can be modified. With reference to FIG. 2A, in one embodiment, the fastening seat 7 is affixed to the base plate 5 by screws. The fastening seat 7 is an enhancement structure, which prevents detection differences caused by temperature variations.

In this embodiment, one single fastening seat 7 corresponds to two probe heads P. However, the disclosure is not meant to restrict the invention. In the different embodiments, one single fastening seat 7 can correspond to one single probe head P, or, one single fastening seat 7 can correspond to more than three probe heads P.

Figure 3A:
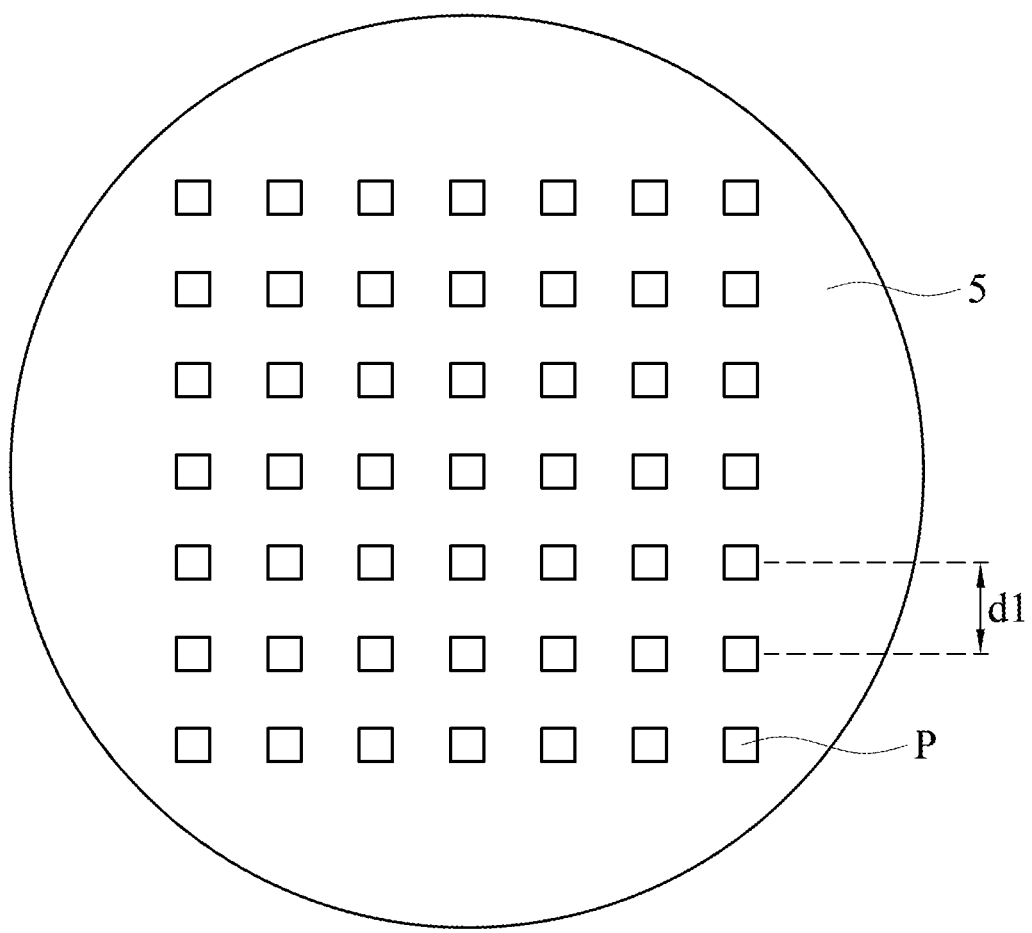
FIG. 3A is a top view of a probe module of another embodiment of the invention.
Figure 3B:
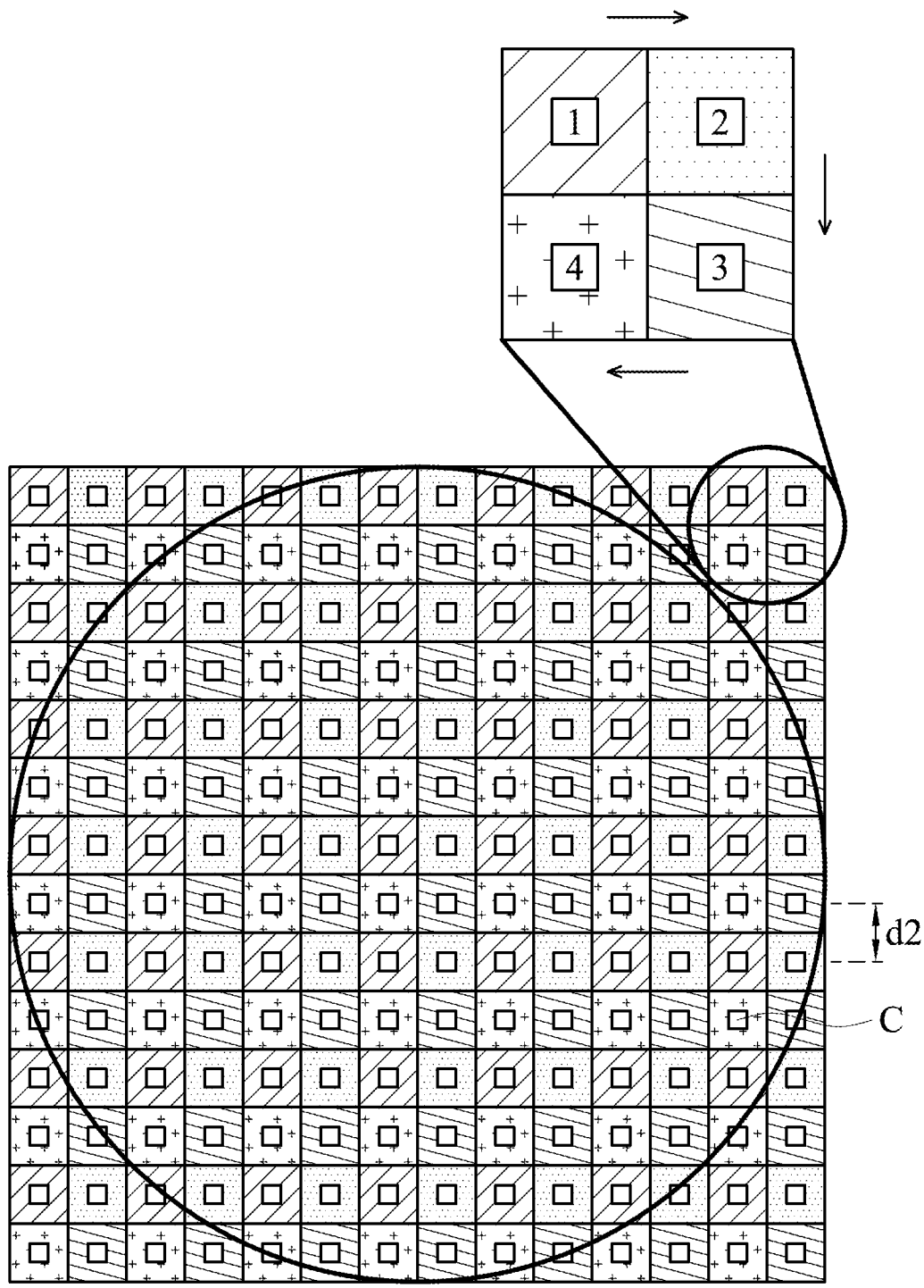
FIG. 3B shows a detecting process performed by the probe module of the embodiment of FIG. 3A.

With reference to FIG. 3A, in one embodiment, the probe heads P are arranged on the base plate 5 in a matrix. With reference to FIGS. 3A and 3B, a first distance d1 is formed between the two adjacent probe heads P. The wafer W to be detected has a plurality of electronic elements C. A second distance d2 is formed between the two adjacent electronic elements C. The first distance d1 is an integral multiple of the second distance d2. Therefore, as shown in FIG. 3B, in one embodiment, the probe heads P can be moved clockwise to rapidly detect the electronic elements C.

Figure 4:
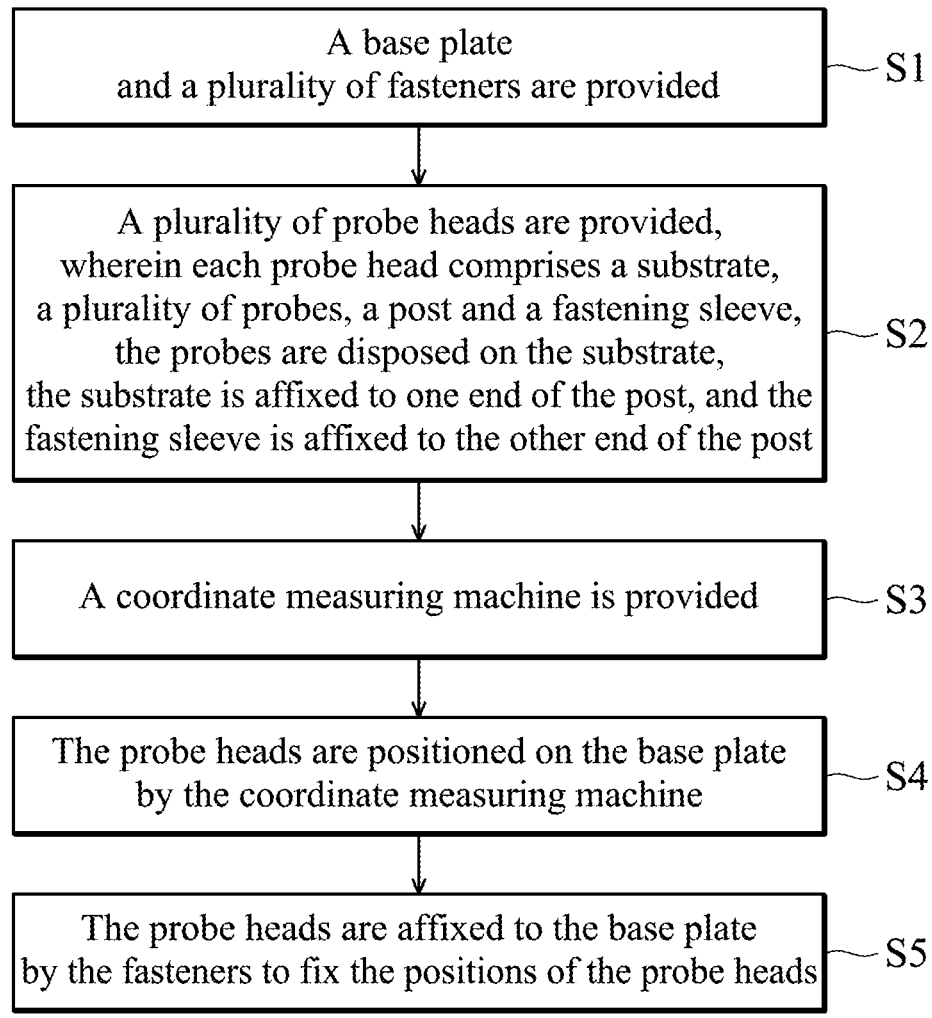
FIG. 4 shows a method for producing the probe module of the embodiment of the invention.

FIG. 4 shows a method for producing a probe module of an embodiment of the invention. First, a base plate and a plurality of fasteners are provided (S1). Then, a plurality of probe heads are provided, wherein each probe head comprises a substrate, a plurality of probes, a post and a fastening sleeve, the probes are disposed on the substrate, the substrate is affixed to one end of the post, and the fastening sleeve is affixed to the other end of the post (S2). Next, a coordinate measuring machine is provided (S3). Then, the probe heads are positioned on the base plate by the coordinate measuring machine (S4). Next, the probe heads are affixed to the base plate by the fasteners to fix the positions of the probe heads (S5).

Figure 5A:
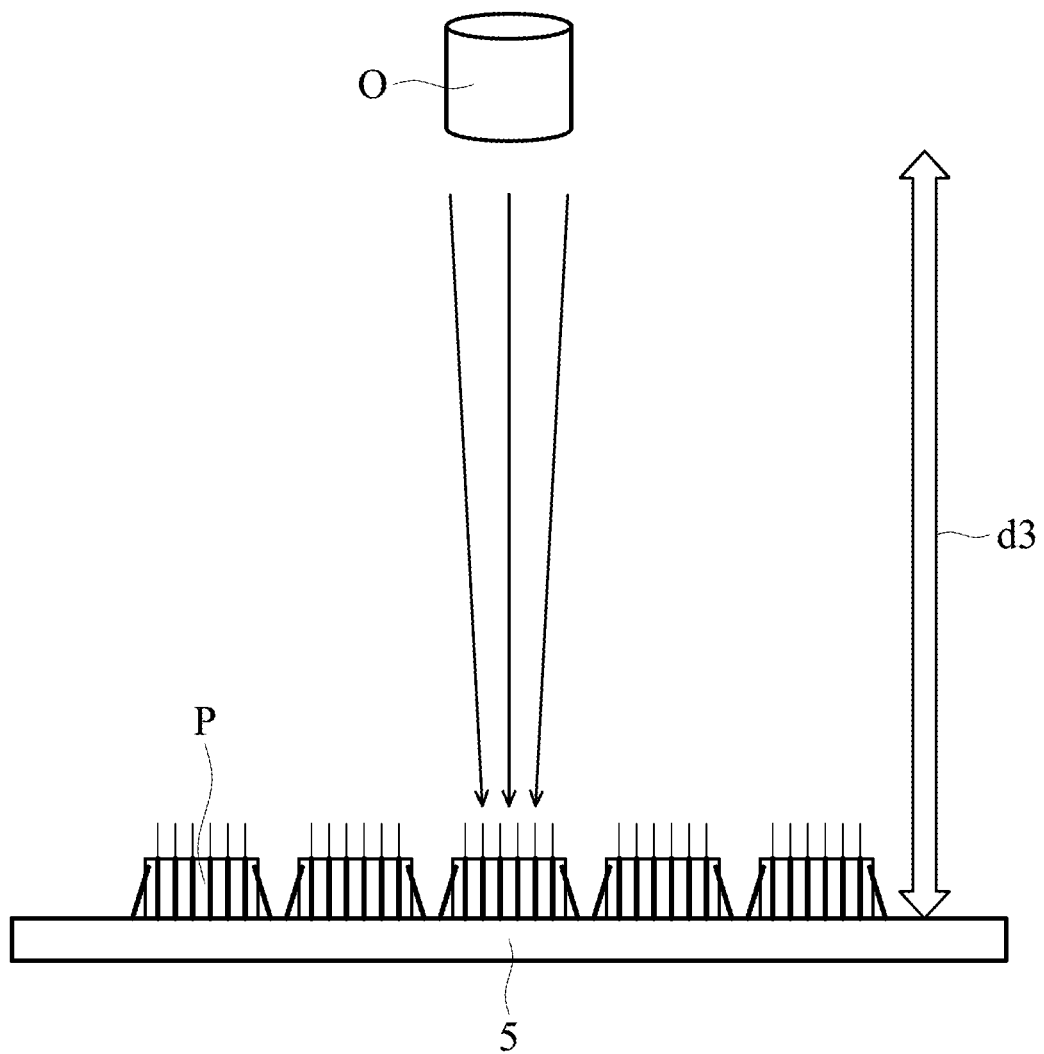
FIG. 5A shows the probe head being positioned with a coordinate measuring machine.
Figure 5B:
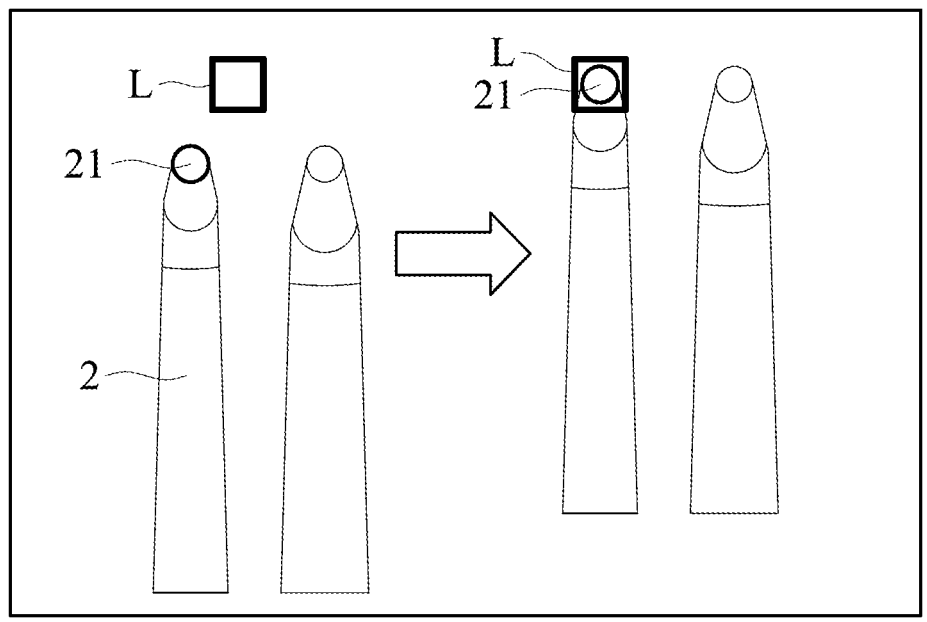
FIG. 5B shows the probe head being aligned with a positioning mark.
Figure 5C:
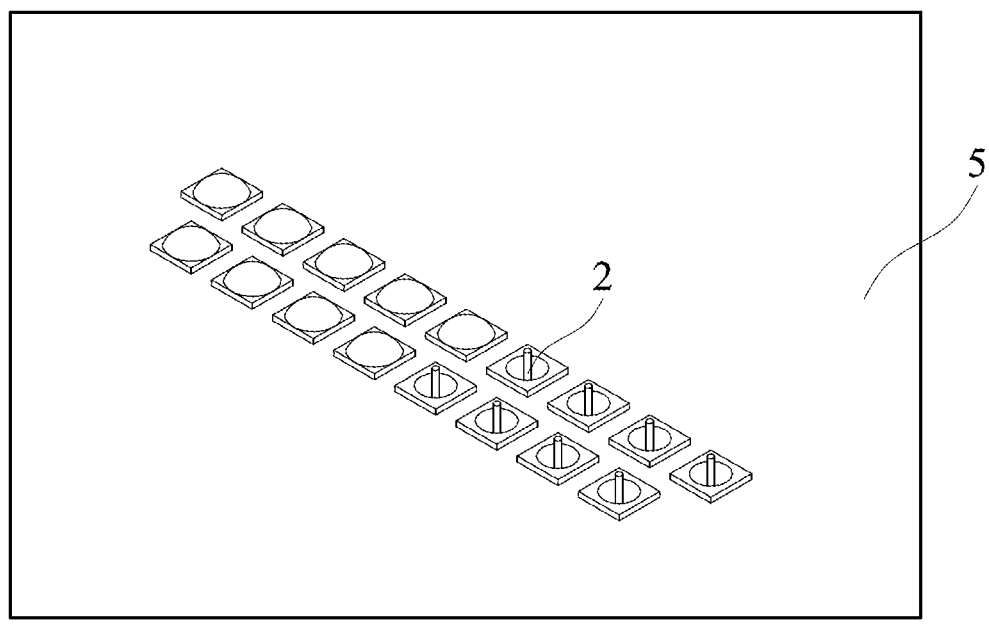
FIG. 5C shows the probe head being welded onto the base plate.

With reference to FIG. 5A, in this embodiment, the coordinate measuring machine O is utilized to position the probe heads P. In the positioning process, a distance d3 is formed between the coordinate measuring machine O and the probe heads P, and the distance is greater than 100 mm. In one embodiment, the distance is greater than 150 mm. The position of one single probe head P therefore can be manually and individually adjusted. With reference to FIG. 5B, one positioning mark L can be formed (for example, printed) on the coordinate measuring machine O, and the operator adjusts the position of the probe head P to align the peak 21 of one of the probes 2 of the probe head with the positioning mark L, and the probe head P is thus positioned in the correct position. Then, the probe heads can be affixed by the fasteners. With reference to FIG. 5C, after the probe heads are affixed, the probes 2 are welded to the base plate 5, and the probe module is completed.

In the embodiment of the invention, the conventional glass mask is replaced by a coordinate measuring machine to position the probe heads. The operating space for positioning the probe heads is therefore increased. Utilizing the probe heads of the embodiment of the invention, the position of the probe heads (probe units) can be adjusted individually, and the probe heads can be assembled. The coordinate measuring machine increases the efficiency of positioning the probe heads. Additionally, the one single probe module of the embodiment of the invention has more probe heads, and the detection efficiency is therefore increased.

Use of ordinal terms such as "first", "second" "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A probe head, comprising:
   a substrate, comprising a first side and a second side, wherein the first side is opposite to the second side;
   a plurality of probes, disposed on the first side of the substrate;
   a post, wherein one end of the post is affixed to the second side of the substrate; and
   a fastening sleeve, affixed to the other end of the post.

2. The probe head as claimed in claim 1, wherein the substrate comprises a rectangular recess, and the probes are arranged on four sides of the rectangular recess.

3. The probe head as claimed in claim 2, wherein the fastening sleeve comprises a threaded hole, the probe head is adapted to be affixed to a base plate, a fastener passes through the base plate and is affixed into the threaded hole to affix the probe head to the base plate.

4. The probe head as claimed in claim 3, wherein the fastening sleeve is wedged into the post by being fitted tightly or with glue.

5. The probe head as claimed in claim 2, wherein the post comprises a positioning recess, and the substrate is wedged into the positioning recess.

6. The probe head as claimed in claim 2, wherein the substrate comprises epoxy resin, the post is cylindrical, and the post comprises ceramic.

7. A probe module, comprising:
   a base plate;
   a plurality of fasteners; and
   a plurality of probe heads, comprising:
      a substrate;
      a plurality of probes, disposed on the substrate;
      a post, wherein the substrate is affixed to one end of the post; and
      a fastening sleeve, affixed to the other end of the post, wherein the fastener passes through the base plate and is affixed into the fastening sleeve to affix the probe head to the base plate.

8. The probe module as claimed in claim 7, further comprising at least one fastening seat, the base plate comprising a first surface and a second surface, wherein the first surface is opposite to the second surface, the probe heads are disposed on the first surface, the fastening seat is disposed on the second surface and corresponds to the probe heads, and the fastener passes through the base plate and the fastening seat and is affixed into the fastening sleeve to affix the probe head to the base plate.

9. The probe module as claimed in claim 7, further comprising a plurality of spacers, wherein the spacers respectively abut the fastening sleeves, and the fastener passes through the spacer.

10. The probe module as claimed in claim 7, wherein the probe heads are arranged in a matrix.

11. A method for producing probe module, comprising:
    providing a base plate and a plurality of fasteners;
    providing a plurality of probe heads, wherein each probe head comprises a substrate, a plurality of probes, a post and a fastening sleeve, the probes are disposed on the substrate, the substrate is affixed to one end of the post, and the fastening sleeve is affixed to the other end of the post;
    providing a coordinate measuring machine;
    positioning the probe heads on the base plate by the coordinate measuring machine; and affixing the probe heads to the base plate with the fasteners, wherein the fasteners pass though the base plate and is affixed into the fastening sleeve to fix the positions of the probe heads.

12. The method for producing a probe module as claimed in claim 11, wherein a distance is formed between the coordinate measuring machine and the probe heads, and the distance is greater than 100 mm.

13. The method for producing a probe module as claimed in claim 11, wherein in the step of positioning the probe heads on the base plate, a peak of one of the probes of each probe head is manually aligned with a positioning mark.

14. The method for producing a probe module as claimed in claim 11, further comprising:
    welding the probes to the base plate.

* * * * *